(12) United States Patent
Wang et al.

(10) Patent No.: US 7,955,519 B2
(45) Date of Patent: Jun. 7, 2011

(54) COMPOSITION AND METHOD FOR PLANARIZING SURFACES

(75) Inventors: Yuchun Wang, Naperville, IL (US); Jason Aggio, Bolingbrook, IL (US); Bin Lu, Naperville, IL (US); John Parker, Naperville, IL (US); Renjie Zhou, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 647 days.

(21) Appl. No.: 11/241,137

(22) Filed: Sep. 30, 2005

(65) Prior Publication Data

US 2007/0075040 A1    Apr. 5, 2007

(51) Int. Cl.
*C09K 13/00* (2006.01)
(52) U.S. Cl. .......... 252/79.1; 252/79.2; 252/79.3; 252/79.4; 438/672; 438/689; 438/693
(58) Field of Classification Search ........ 252/79.1–79.4; 438/672, 689, 693; 451/36; 456/36, 41
See application file for complete search history.

(56) References Cited

U.S. PATENT DOCUMENTS

| | | | |
|---|---|---|---|
| 4,657,754 A | 4/1987 | Bauer et al. | |
| 4,929,257 A | 5/1990 | Miyazaki et al. | |
| 5,693,239 A | 12/1997 | Wang et al. | |
| 5,710,069 A * | 1/1998 | Farkas et al. | 438/7 |
| 6,436,811 B1 | 8/2002 | Wake et al. | |
| 6,444,139 B1 | 9/2002 | Minamihaba et al. | |
| 6,521,574 B1 | 2/2003 | Hirabayashi et al. | |
| 6,562,719 B2 | 5/2003 | Kondo et al. | |
| 6,579,153 B2 | 6/2003 | Uchikura et al. | |
| 6,585,568 B2 * | 7/2003 | Tsuchiya et al. | 451/36 |
| 6,750,128 B2 | 6/2004 | Kondo et al. | |
| 6,773,476 B2 | 8/2004 | Sakai et al. | |
| 6,852,632 B2 | 2/2005 | Wang et al. | |
| 6,867,140 B2 | 3/2005 | Wang et al. | |
| 6,896,591 B2 | 5/2005 | Chaneyalew et al. | |
| 6,936,543 B2 | 8/2005 | Schroeder et al. | |
| 2001/0006225 A1 | 7/2001 | Tsuchiya et al. | |
| 2002/0111027 A1 | 8/2002 | Sachan et al. | |
| 2003/0006396 A1 | 1/2003 | Wang et al. | |
| 2003/0153184 A1 | 8/2003 | Wang et al. | |
| 2003/0170991 A1 | 9/2003 | Wang et al. | |
| 2003/0178320 A1 | 9/2003 | Liu et al. | |
| 2003/0181142 A1 | 9/2003 | De Rege Thesauro et al. | |
| 2003/0228763 A1 | 12/2003 | Schroeder et al. | |
| 2003/0234184 A1 | 12/2003 | Liu et al. | |

(Continued)

FOREIGN PATENT DOCUMENTS

EP    1 150 341    10/2001

(Continued)

*Primary Examiner* — Duy-Vu N Deo
*Assistant Examiner* — Maki A Angadi
(74) *Attorney, Agent, or Firm* — Thomas E. Omholt; Susan Steele; Steven D. Weseman

(57) ABSTRACT

The invention provides compositions and methods for planarizing or polishing a surface. One composition comprises about 0.01 wt. % to about 20 wt. % α-alumina particles, wherein the α-alumina particles have an average diameter of 200 nm or less, and 80% of the α-alumina particles have a diameter of about 500 nm or less, an organic acid, a corrosion inhibitor, and water. Another composition comprises α-alumina particles, an organic acid, dual corrosion inhibitors of triazole and benzotriazole, wherein the wt. % ratio of the triazole to benzotriazole is about 0.1 to about 4.8, and water.

24 Claims, 1 Drawing Sheet

U.S. PATENT DOCUMENTS

| | | |
|---|---|---|
| 2004/0115944 A1 | 6/2004 | Matsui |
| 2004/0157535 A1 | 8/2004 | Chaneyalew et al. |
| 2004/0171264 A1 | 9/2004 | Kondo et al. |
| 2004/0197263 A1 | 10/2004 | Wang |
| 2004/0198584 A1 | 10/2004 | Wang |
| 2005/0090109 A1 | 4/2005 | Carter et al. |
| 2005/0211950 A1 | 9/2005 | De Rege Thesauro et al. |

FOREIGN PATENT DOCUMENTS

| | | |
|---|---|---|
| EP | 1 279 708 A1 | 1/2003 |
| WO | WO 03/050864 | 6/2003 |
| WO | WO 2005/019364 | 3/2005 |

* cited by examiner

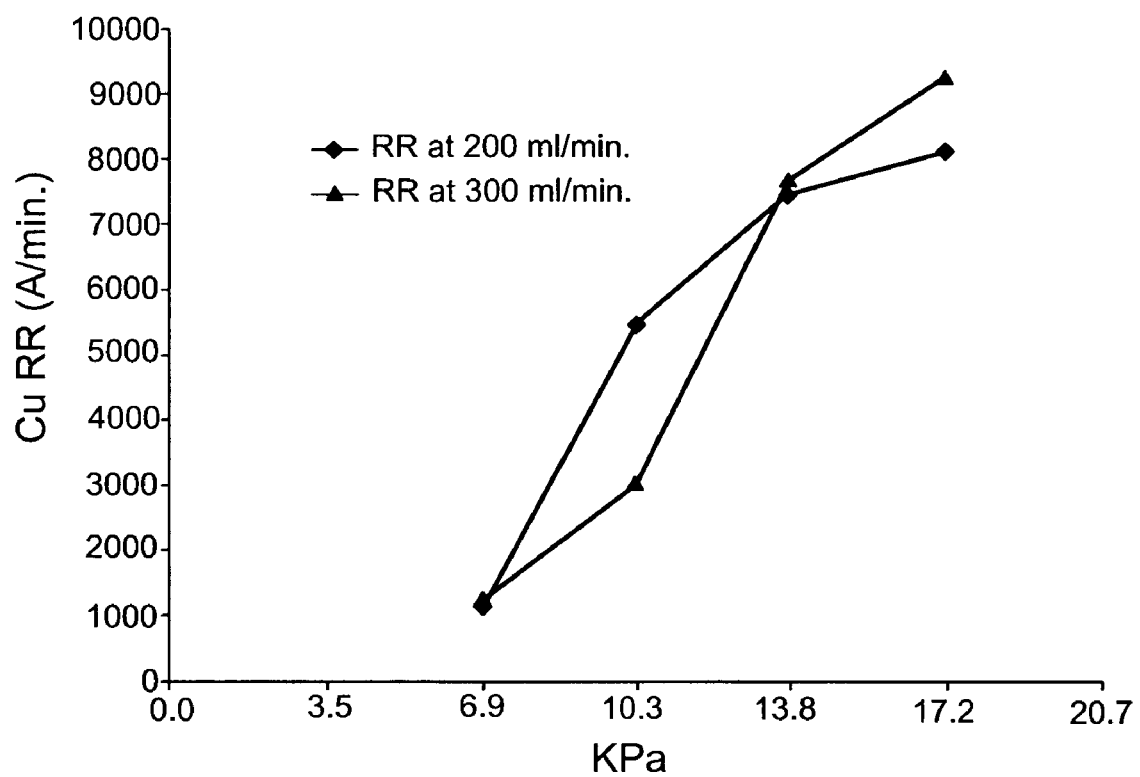
FIG.

US 7,955,519 B2

COMPOSITION AND METHOD FOR PLANARIZING SURFACES

FIELD OF THE INVENTION

This invention pertains to a chemical-mechanical polishing composition and a method of polishing a substrate using the same.

BACKGROUND OF THE INVENTION

Compositions and methods for planarizing or polishing the surface of a substrate are well known in the art. Polishing slurries typically contain an abrasive material in an aqueous solution and are applied to a surface by contacting the surface with a polishing pad saturated with the slurry composition.

Conventional polishing compositions typically are not entirely satisfactory at planarizing copper layers found in semiconductor wafers. To meet industry demands, it is important to use a polishing composition that has a high polishing efficiency and removal rate and leaves a high quality polish with minimal surface defects. However, prior art polishing slurries for copper can have less than desirable polishing rates which are unable to satisfy throughput demands.

One approach to increase polishing rates for copper layers is to use more aggressive abrasives, such as aluminum oxide particles. There are several types of aluminum oxides, including α-alumina, γ-alumina, and θ-alumina. The use of γ-alumina and θ-alumina for polishing copper is well known in the art. See, for example, U.S. Pat. No. 6,521,574 and U.S. Pat. No. 6,436,811. However, α-alumina particles, the most aggressive type of aluminum oxide particles, are typically used to polish harder substrates that are less susceptible to scratching, such as noble metals. See U.S. Patent Application Publication 2002/0111027 A1.

Various strategies have been employed to obtain high removal rates by utilizing α-alumina while simultaneously minimizing scratching and erosion. For example, α-alumina particles can be coated with a surfactant to minimize scratches during polishing, as illustrated in U.S. Patent Application Publication 2003/0006396 A1. More commonly, a polishing slurry will contain a mixture of solids consisting of α-alumina particles and less abrasive solids. See, for example, U.S. Pat. No. 5,693,239, U.S. Pat. No. 6,444,139, U.S. Patent Application Publication 2004/0115944 A1, U.S. Patent Application Publication 2004/0157535 A1, and U.S. Patent Application Publication 2003/0181142 A1.

There remains a need for other compositions and methods for polishing copper-containing substrates. The invention provides such compositions and methods.

BRIEF SUMMARY OF THE INVENTION

The invention provides a chemical-mechanical polishing composition for polishing of a substrate having a copper-containing film at the surface, comprising about 0.01 wt. % to about 20 wt. % α-alumina particles, wherein the α-alumina particles have an average diameter of 200 nm or less, and 80% of the α-alumina particles have a diameter of about 500 nm or less, (b) an organic acid, (c) a corrosion inhibitor, and (d) water, wherein the polishing composition has a pH of about 4 to about 14. The invention further provides a method of chemically-mechanically polishing a substrate having a copper-containing film at the surface, comprising (i) contacting a substrate with a polishing pad and a chemical-mechanical polishing composition comprising (a) about 0.01 wt. % to about 20 wt. % α-alumina particles, wherein the α-alumina particles have an average diameter of 200 nm or less, and 80% of the α-alumina particles have a diameter of about 500 nm or less, (b) an organic acid, (c) a corrosion inhibitor, and (d) water, wherein the polishing composition has a pH of about 4 to 14, (ii) moving the polishing pad relative to the substrate with the chemical-mechanical polishing composition therebetween, and (iii) abrading at least a portion of the substrate to polish the substrate.

Additionally, the invention provides a chemical-mechanical polishing composition for polishing of a substrate having a copper-containing film at the surface, comprising (a) about 0.01 wt. % to about 20 wt. % α-alumina particles, (b) an organic acid, (c) dual corrosion inhibitors of triazole and benzotriazole, wherein the wt. % ratio of the triazole to benzotriazole is about 0.1 to about 4.8, and (d) water, wherein the polishing composition has a pH of about 4 to 14. The invention further provides a method of chemically-mechanically polishing a substrate having a copper-containing film at the surface, (i) contacting a substrate with a polishing pad and a chemical-mechanical polishing composition comprising (a) about 0.01 wt. % to about 20 wt. % α-alumina particles, (b) an organic acid, (c) dual corrosion inhibitors of triazole and benzotriazole, wherein the wt. % ratio of the triazole to benzotriazole is about 0.1 to about 4.8, and (d) water, wherein the polishing composition has a pH of about 4 to 14, (ii) moving the polishing pad relative to the substrate with the chemical-mechanical polishing composition therebetween, and (iii) abrading at least a portion of the substrate to polish the substrate.

BRIEF DESCRIPTION OF THE DRAWINGS

The FIGURE is a graph of the removal rate of copper from a substrate polished with a composition of the invention as a function of down force pressure on the substrate against a polishing pad.

DETAILED DESCRIPTION OF THE INVENTION

The invention provides a chemical-mechanical polishing composition for polishing a substrate having a copper-containing film at the surface comprising (a) α-alumina particles, (b) an organic acid, (c) a corrosion inhibitor, and (d) water. The polishing composition desirably allows for reduced scratching and erosion, while allowing for enhanced removal rates, in the polishing of substrates having a copper-containing film at the surface.

The polishing composition comprises an abrasive comprising α-alumina particles. The α-alumina particles can be present in the polishing composition in any suitable amount. Typically, α-alumina is present in the polishing composition in an amount of about 0.01 wt. % or more, preferably about 0.1 wt. % or more, more preferably about 0.3 wt. % or more, and most preferably about 0.5 wt. % or more, based on the total weight of the polishing composition. Typically, α-alumina is present in the polishing composition in amount of about 20 wt. % or less, preferably about 5 wt. % or less, more preferably about 1 wt. % or less, and most preferably about 0.7 wt. % or less, based on the total weight of the polishing composition.

The α-alumina particles of the composition have an average diameter (typically, average particle diameter of the smallest spheres encompassing the particles) of 200 nm or less, and 80% of the α-alumina particles have a diameter of about 500 nm or less. Preferably, the α-alumina particles have an average diameter of 200 nm or less, and 90% of the α-alumina particles have a diameter of 500 nm or less. More preferably, the α-alumina particles have an average diameter of 100 nm or less, and 95% of the α-alumina particles have a diameter of 500 nm or less. Most preferably, the α-alumina particles have an average diameter of 100 nm or less, and 90% of the α-alumina particles have a diameter of 200 nm or less. The percentage values used herein to described the nature of the α-alumina particles in terms of particle diameter are percentages "by number," rather than being percentages "by weight," unless otherwise noted The percentage values used herein to described the nature of the α-alumina particles in terms of particle diameter are percentages "by number," rather than being percentages "by weight," unless otherwise noted. The particle diameter can be measured by any suitable technique, including, for example, sedimentation field flow fractionation, dynamic and static light scattering, and disk centrifugation.

The polishing composition further comprises an organic acid. Preferred organic acids are selected from the group consisting of malonic acid, succinic acid, adipic acid, lactic acid, maleic acid, malic acid, citric acid, glycine, aspartic acid, tartaric acid, gluconic acid, iminodiacetic acid, and fumaric acid, or any carboxylic or amino carboxylic acid. Preferably, the organic acid is tartaric acid.

The polishing composition can comprise any suitable amount of the organic acid and typically comprises about 0.01 wt. % or more of such acid. Preferably, the polishing composition comprises about 0.05 wt. % or more organic acid, and more preferably about 0.08 wt. % or more organic acid. Typically, the polishing composition comprises about 5 wt. % or less organic acid. Preferably, the polishing composition comprises about 3 wt. % or less organic acid, and more preferably about 1 wt % or less organic acid.

It will be appreciated that the aforementioned carboxylic acids can exist in the form of a salt (e.g., a metal salt, an ammonium salt, or the like), an acid, or as a partial salt thereof. For example, tartrates include tartaric acid, as well as mono- and di-salts thereof. Furthermore, carboxylic acids including basic functional groups can exist in the form of an acid salt of the basic functional group. For example, glycines include glycine, as well as acid salts thereof. Furthermore, some compounds can function both as an acid and as a chelating agent (e.g., certain amino acids and the like).

The corrosion inhibitor (i.e., a film-forming agent) can be any suitable corrosion inhibitor. Typically, the corrosion inhibitor is an organic compound containing a heteroatom-containing functional group. For example, the corrosion inhibitor is a heterocyclic organic compound with at least one 5- or 6-member heterocyclic ring as the active functional group, wherein the heterocyclic ring contains at least one nitrogen atom. Preferably, the corrosion inhibitor is selected from the group consisting of 1,2,3-triazole, 1,2,4-triazole, benzotriazole, benzimidazole, benzothiazole, and mixtures thereof. Most preferably, the composition comprises dual corrosion inhibitors of triazole and benzotriazole. Typically, the wt. % ratio of the triazole to benzotriazole is about 0.1 to about 4.8, more preferably about 0.1 to about 4.4.

A liquid carrier is used to facilitate the application of the abrasive (when present and suspended in the liquid carrier) and any components dissolved or suspended therein to the surface of a suitable substrate to be polished (e.g., planarized). The liquid carrier is typically an aqueous carrier and can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

The polishing composition can have any suitable pH. For example, the polishing composition can have a pH of about 4 to about 14. Typically, the polishing compositions have a pH of about 6 or greater, or more preferably 7 or greater. The pH of the polishing composition typically is 10 or less, or more preferably 9 or less.

The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be nitric acid, potassium hydroxide, or a combination thereof. The pH buffering agent can be any suitable buffering agent, for example, phosphates, sulfates, acetates, borates, ammonium salts, and the like. The polishing composition can comprise any suitable amount of a pH adjustor and/or a pH buffering agent, provided that a suitable amount is used to achieve and/or maintain the pH of the polishing composition within the ranges set forth.

The polishing composition can further comprise an oxidizing agent. The oxidizing agent oxidizes a portion of the substrate to be removed by polishing the substrate with the polishing composition, desirably copper. Suitable oxidizing agents include inorganic and organic per-compounds, bromates, bromites, nitrates, chlorates, chlorites, hypochlorites, chromates, iodates, iron and copper salts (e.g., nitrates, sulfates, ethylenediaminetetraacetic acid (EDTA), and citrates), rare earth and transition metal oxides (e.g., osmium tetraoxide), potassium ferricyanide, potassium dichromate, iodic acid, and the like. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The oxidizing agent preferably is selected from the group consisting of bromates, bromites, chlorates, chlorites, hydrogen peroxide, hypochlorites, iodates, monoperoxy sulfate, monoperoxy sulfite, monoperoxyphosphate, monoperoxyhypophosphate, monoperoxypyrophosphate, organo-halo-oxy compounds, periodates, permanganate, peroxyacetic acid, and mixtures thereof. Preferably, the oxidizing agent preferably is hydrogen peroxide. When an oxidizing agent is present in the polishing composition, the oxidizing agent preferably comprises about 10 wt. % or less (e.g., about 8 wt. % or less, or about 6 wt. % or less) of the composition.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., acids, bases, etc.) as well as any combination of ingredients (e.g., acids, bases, inhibitors, etc.).

For example, the abrasive can be dispersed in a suitable liquid carrier. The corrosion inhibitor and the organic acid then can be added, and mixed by any method that is capable of incorporating the components into the polishing composition. If an oxidizing agent is desired, the oxidizing agent can be added at any time during the preparation of the polishing composition. The polishing composition can be prepared prior to use, with one or more components, such as an optional oxidizing agent, added to the polishing composition shortly before use (e.g., within about 1 minute before use, or within about 1 hour before use, or within about 7 days before use). The polishing composition also can be prepared by mixing the components at the surface of the substrate during the polishing operation.

The polishing composition can be supplied as a one package system comprising α-alumina, a corrosion inhibitor, an organic acid, and a liquid carrier. Alternatively, the α-alumina can be supplied as a dispersion in a liquid carrier in a first container, and a corrosion inhibitor and an organic acid can be supplied in a second container, either in dry form, or as a solution or dispersion in the liquid carrier. Optional components, such as an oxidizing agent, can be placed in the first and/or second containers or a third container. Furthermore, the components in the first or second container can be in dry form while the components in the corresponding container can be in the form of an aqueous dispersion. Moreover, it is suitable for the components in the first or second containers to have different pH values, or alternatively to have substantially similar, or even equal, pH values. If an optional component such as an oxidizing agent is a solid, it may be supplied either in dry form or as a mixture in the liquid carrier. The oxidizing agent desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Other two-container, or three or more container, combinations of the components of the polishing composition are within the knowledge of one of ordinary skill in the art.

The polishing composition of the invention also can be provided as a concentrate which is intended to be diluted with an appropriate amount of liquid carrier prior to use. In such an embodiment, the polishing composition concentrate can comprise the alumina, the organic acid, the corrosion inhibitor, and the liquid carrier in amounts such that, upon dilution of the concentrate with an appropriate amount of water, each component of the polishing composition will be present in the polishing composition in an amount within the appropriate range recited above for each component. For example, the α-alumina, a corrosion inhibitor, and an organic acid can each be present in the concentration in an amount that is about 2 times (e.g., about 3 times, about 4 times, or about 5 times) greater than the concentration recited above for each component so that, when the concentrate is diluted with an equal volume of liquid carrier (e.g., 2 equal volumes of liquid carrier, 3 equal volumes of liquid carrier, or 4 equal volumes of liquid carrier, respectively), each component will be present in the polishing composition in an amount within the ranges set forth above for each component. Furthermore, as will be understood by those of ordinary skill in the art, the concentrate can contain an appropriate fraction of the liquid carrier present in the final polishing composition in order to ensure that the organic acid, the corrosion inhibitor, and other suitable additives are at least partially or fully dissolved in the concentrate.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the case that more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention further provides a method of chemically-mechanically polishing a substrate comprising (i) contacting a substrate with a polishing pad and the polishing compositions described herein, (ii) moving the polishing pad relative to the substrate with the chemical-mechanical polishing composition therebetween, and (iii) abrading at least a portion of the substrate to polish the substrate.

The substrate can be any suitable substrate. The method of the invention is especially useful for polishing (e.g., planarizing) a substrate comprising at least one metal layer comprising copper. The substrate is preferably a microelectronic (e.g., semiconductor) substrate.

The polishing method of the invention is particularly suited for in conjunction with a chemical-mechanical polishing (CMP) apparatus. Typically, the apparatus comprises a platen, which, when is use, is in motion and has a velocity that results form orbital, linear, or circular motion, a polishing pad in contact with the platen and moving with the platen when in motion, and a carrier that holds a substrate to be polished by contacting and moving relative to the surface of the polishing pad. The polishing of the substrates takes place by the substrate being placed in contact with the polishing pad and the polishing composition of the invention and then the polishing pad moving relative to the substrate so as to abrade at least a portion of the substrate to polish the substrate. Typically, the down force pressure is about 3 kPa or more, and preferably about 6 kPa or more. Typically, the down force pressure is 21 kPa or less, preferably about 14 kPa or less, and more preferably about 11 kPa or less.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound under compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The following examples further illustrate the invention but, of course, should not be construed as in any way limiting its scope.

EXAMPLE 1

This example demonstrates removal rate and planarization efficiency of the inventive composition at various down force pressures against a substrate. Similar substrates comprising Cu-plated 300 mm wafers were polished with polishing compositions comprising 0.7 wt. % α-alumina, 0.8 wt. % tartaric acid, and dual inhibitors of benzotriazole and triazole in water. The α-alumina particles had an average diameter of 100 nm. The polishing experiments generally involved the use of a commercially available polishing apparatus equipped with a polishing pad, and the polishing parameters except down force pressure and polishing composition flow rate were the same for all polishing experiments. Following polishing, the copper removal rate was determined in Å/min. A lower number reflects a lower rate of polishing, e.g., a lower amount of removal of the copper from the surface of the substrate. The results are summarized in Table 1.

TABLE 1

Effect of down force pressure on copper removal

| Polishing Composition Flow Rate (ml/min) | Down Force Pressure (kPa) | Copper Removal Rate (Å/min) |
|---|---|---|
| 200 | 6.9 | 1100 |
| 200 | 10.3 | 5600 |
| 200 | 13.8 | 7500 |
| 200 | 17.2 | 8000 |
| 300 | 6.9 | 1100 |
| 300 | 10.3 | 3000 |
| 300 | 13.8 | 7600 |
| 300 | 17.2 | 9200 |

The data of Table 1 is plotted in the graph of the FIGURE, which depicts the copper removal rate resulting from the use of the polishing composition at various down force pressures. The steep slope indicates high planarization efficiency. The planarization efficiency is the difference between the initial step height and the final step divided by the initial step height. The planarization efficiency is 80-90% after 2000 Å copper removal. The wafers were fully planarized after 5000 Å copper removal.

EXAMPLE 2

This example demonstrates the effect of α-alumina on dishing and on the polishing removal rate of copper-containing layers.

Two polishing compositions were used to polish a substrate comprising a copper-containing layer. Composition 1A contained α-alumina (invention) and composition 1B contained fumed alumina (comparative). The polishing removal rates (RR) for the copper layer in Å/min and the amount of dishing after 30 seconds of overpolishing in Å were determined for each of the polishing compositions. The polishing was conducted with a down force pressure of 10.3 kPa. The results are summarized in Table 2.

TABLE 2

Effect of α-alumina on polishing removal rates and dishing

| Polishing Composition | Copper Removal Rate (Å/min) | Dishing (Å) |
|---|---|---|
| 1A (invention) | 3000 | 450 |
| 1B (comparative) | 1800 | 650 |

These results demonstrate that dishing of copper-containing substrates can be substantially reduced while maintaining high removal rates through the use of a polishing composition in accordance with the invention.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing composition for polishing of a substrate having a copper-containing film at the surface, comprising:
   (a) about 0.01 wt. % to about 20 wt. % α-alumina particles, wherein the α-alumina particles have an average diameter of 200 nm or less, and 90% of the α-alumina particles have a diameter of about 500 nm or less,
   (b) an organic acid,
   (c) a corrosion inhibitor, and
   (d) water,
wherein the polishing composition has a pH of about 4 to about 14.

2. The polishing composition of claim 1, wherein the α-alumina particles have an average diameter of 100 nm or less and 90% of the α-alumina particles have a diameter of 200 nm or less.

3. The polishing composition of claim 1, wherein the α-alumina particles are present in an amount of about 0.1 wt. % to about 5 wt. %.

4. The polishing composition of claim 3, wherein the α-alumina particles are present in an amount of about 0.3 wt. % to about 1 wt. %.

5. The polishing composition of claim 1, wherein the polishing composition has a pH of about 6 to 10.

6. The polishing composition of claim 1, wherein the corrosion inhibitor is selected from the group consisting of 1,2,3-triazole, 1,2,4-triazole, benzotriazole, benzimidazole, benzothiazole, and mixtures thereof.

7. The composition of claim 6, wherein the corrosion inhibitor is a mixture of triazole and benzotriazole.

8. The composition of claim 7, wherein the mixture of triazole and benzotriazole has a triazole to benzotriazole wt. % ratio of about 0.1 to about 4.8.

9. The composition of claim 8, wherein the mixture of triazole and benzotriazole has a triazole to benzotriazole wt. % ratio of about 0.1 to about 4.4.

10. The polishing composition of claim 1, wherein the organic acid is selected from the group consisting of malonic acid, succinic acid, adipic acid, lactic acid, malic acid, citric acid, glycine, aspartic acid, tartaric acid, gluconic acid, iminodiacetic acid, and fumaric acid.

11. The polishing composition of claim 10, wherein the organic acid is tartaric acid.

12. The polishing composition of claim 1, further comprising an oxidizing agent selected from the group consisting of bromates, bromites, chlorates, chlorites, hydrogen peroxide, hypochlorites, iodates, monoperoxy sulfate, monoperoxy sulfite, monoperoxyphosphate, monoperoxyhypophosphate, monoperoxypyrophosphate, organo-halo-oxy compounds, periodates, permanganate, peroxyacetic acid, and mixtures thereof.

13. The polishing composition of claim 1, wherein the α-alumina particles have an average diameter of 100 nm or less and 95% of the α-alumina particles have a diameter of 500 nm or less.

14. The method of chemically-mechanically polishing a substrate having a copper-containing film at the surface comprising:
   (i) contacting a substrate with a polishing pad and a chemical-mechanical polishing composition comprising:
      (a) about 0.01 wt. % to about 20 wt. % α-alumina particles, wherein the α-alumina particles have an average diameter of 200 nm or less, and 90% of the α-alumina particles have a diameter of about 500 nm or less,
      (b) an organic acid,
      (c) a corrosion inhibitor,
      (d) an oxidizing agent, and
      (e) water
   wherein the polishing composition has a pH of about 4 to 14,
   (ii) moving the polishing pad relative to the substrate with chemical-mechanical polishing composition therebetween, and
   (iii) abrading at least a portion of the substrate to polish the substrate.

15. The method of claim 14, wherein the α-alumina particles have an average diameter of 100 nm or less and 90% of the α-alumina particles have a diameter of 200 nm or less.

16. The method of claim 14, wherein the polishing pad is moving relative to the substrate with a down force pressure of about 3 kPa to about 21 kPa.

17. The method of claim 14, wherein the α-alumina particles are present in an amount of about 0.1 wt. % to about 5 wt. %.

18. The method of claim 17, wherein the α-alumina particles are present in an amount of about 0.3 wt. % to about 1 wt. %.

19. The method of claim 14, wherein the polishing composition has a pH of about 6 to 10.

20. The method of claim 14, wherein the corrosion inhibitor is selected from the group consisting of 1,2,3-triazole, 1,2,4-triazole, benzotriazole, benzimidazole, benzothiazole, and mixtures thereof.

21. The method of claim 14, wherein the organic acid is selected from the group consisting of malonic acid, succinic acid, adipic acid, lactic acid, malic acid, citric acid, glycine, aspartic acid, tartaric acid, gluconic acid, iminodiacetic acid, and fumaric acid.

22. The method of claim 21, wherein the organic acid is tartaric acid.

23. The method of claim 14, wherein the oxidizing agent is selected from the group consisting of bromates, bromites, chlorates, chlorites, hydrogen peroxide, hypochlorites, iodates, monoperoxy sulfate, monoperoxy sulfite, monoperoxyphosphate, monoperoxyhypophosphate, monoperoxypyrophosphate, organo-halo-oxy compounds, periodates, permanganate, peroxyacetic acid, and mixtures thereof.

24. The method of claim 14, wherein the α-alumina particles have an average diameter of 100 nm or less and 95% of the α-alumina particles have a diameter of 500 nm or less.

* * * * *